United States Patent [19]

Beaverson et al.

[11] 4,035,672

[45] July 12, 1977

[54] ACOUSTIC TRANSDUCER WITH A DUAL PURPOSE PIEZOELECTRIC ELEMENT

[75] Inventors: Wayne A. Beaverson; James N. Hufford, both of Elkhart, Ind.

[73] Assignee: CTS Corporation, Elkhart, Ind.

[21] Appl. No.: 547,388

[22] Filed: Feb. 6, 1975

[51] Int. Cl.² .......... H01L 41/04

[52] U.S. Cl. .......... 310/8.7; 310/8.6; 310/8.2

[58] Field of Search .......... 310/8.1, 8.2, 8.5, 8.6, 310/9.1, 9.4; 318/116; 331/111, 116 R; 179/110 A; 340/384 E

[56] References Cited

U.S. PATENT DOCUMENTS

| | | | |
|---|---|---|---|
| 2,242,755 | 5/1941 | Pope | 310/8.6 |
| 2,444,620 | 7/1948 | Williams et al. | 179/110 A |
| 2,957,954 | 10/1960 | Swinehart | 179/110 A |
| 3,206,558 | 9/1965 | Shoot | 310/8.5 X |
| 3,277,465 | 10/1966 | Potter | 179/110 A |
| 3,283,299 | 11/1966 | Savino | 340/384 E |
| 3,360,772 | 12/1967 | Massa | 340/10 |
| 3,548,116 | 12/1970 | Schafft | 179/110 A |
| 3,660,602 | 5/1972 | Thompson | 310/8.5 |
| 3,701,865 | 10/1972 | Carlson | 179/110 A |
| 3,786,202 | 1/1974 | Schafft | 310/8.3 |
| 3,833,865 | 9/1974 | Palmer | 331/111 X |

*Primary Examiner*—Mark O. Budd
*Attorney, Agent, or Firm*—John J. Gaydos

[57] ABSTRACT

An acoustic transducer having a piezoelectric element secured to a conical diaphragm with the piezoelectric element forming part of a relaxation oscillator circuit. The piezoelectric element performs the dual function of firstly developing acoustic energy and transferring such energy to the diaphragm and secondly functioning as an electronic component in the oscillator circuit by operating as a frequency determining capacitor in such circuit. The diaphragm and the piezoelectric element are enclosed in a housing. Portions of the housing are deformed and penetrate the base of the diaphragm for securing the diaphragm to the housing. A post integral with the housing extends inwardly from the base toward the apex of the diaphragm and one end of the post is disposed adjacent the apex to prevent collapse of the diaphragm.

7 Claims, 4 Drawing Figures

ACOUSTIC TRANSDUCER WITH A DUAL PURPOSE PIEZOELECTRIC ELEMENT

The present invention relates to acoustic transducers, and more particularly, to an acoustic transducer of the piezoelectric type.

Acoustic transducers such as shown in U.S. Pat. No. 3,548,116 often employ a piezoelectric element secured to a diaphragm and connected to a source of electric signals. The electric signals excite the piezoelectric element into mechanical vibration and the vibrations are transferred to the diaphragm developing acoustic energy. In other transducer systems such as disclosed in U.S. Pat. No. 3,739,299, piezoelectric elements have been used as a frequency determining capacitor. In such a system, the piezoelectric element is used as a capacitor in a tuned circuit. The purpose of the piezoelectric element is to tune a circuit to drive an oscillator at a particular frequency. This circuit arrangement however, requires both a relatively complex oscillator circuit and a tuned circuit and is therefore relatively uneconomical. It would therefore be desirable to eliminate circuit components in an acoustic transducer system by employing a piezoelectric element performing the dual function of firstly developing acoustic energy and transferring such energy to a diaphragm and secondly functioning as an electronic component in a relaxation oscillator circuit by operating as a frequency determining cpacitor in such circuit.

In acoustic transducers employing a conical diaphragm, generally, the base of the diaphragm is fixedly secured with a suitable adhesive to a supporting frame or housing. Adhesives, however, are generally relatively difficult to handle and apply uniformly in a manufacturing process, particularly in high volume production. The temperature and other factors affecting the application of adhesives often result in unacceptable attachment of the diaphragm to the housing and it is difficult to visually inspect and determine the quality of adhesion of the diaphragm to the housing. A diaphragm that is not uniformly secured to the housing distorts the acoustic signals generated by the diaphragm. It would therefore be desirable to provide a reliable means of securing a diaphragm to a housing wherein portions of the housing are deformed and penetrate the base of the diaphragm for securing the diaphragm to the housing.

Some applications of acoustic transducers often involve severe mechanical shocks to the transducer. In transducers employing a relatively flexible conical diaphragm, severe mechanical shocks cause collapse of the diaphragm destroying the effectiveness of the transducer. One solution is to provide a stiffer conical diaphragm. However, for a given diaphragm material, a stiffer, less flexible diaphragm often decreases the acoustic energy output for a given energy input. That is, the more rigid the diaphragm, the less decibel output there may be for an equivalent input to the diaphragm. Often, the efficiency required in an acoustic transducer using a given diaphragm material requires a relatively flexible conical diaphragm. It would therefore be desirable to provide means to prevent collapse of a conical diaphragm in an acoustic transducer when subjected to severe mechanical shocks.

Accordingly, it is an object of the present invention to provide a new and improved acoustic transducer of the piezoelectric type.

Another object of the present invention is to provide a relatively economical acoustic transducer by employing a piezoelectric element as a frequency determining capacitor in a relaxation oscillator circuit.

Another object of the present invention is to provide a new and improved acoustic transducer wherein a piezoelectric element performs the dual function of firstly developing acoustic energy and transferring such energy to a diaphragm and secondly functioning as an electronic component in an oscillator circuit by operating as a frequency determining capacitor in such circuit.

Another object of the present invention is to provide a new and improved acoustic transducer wherein a conical diaphragm is secured to a housing by deforming portions of the housing into engagement with the base of the diaphragm.

Still another object of the present invention is to provide means for preventing collapse of a conical diaphragm secured to a housing due to mechanical shocks to the housing.

A still further object of the present invention is to provide a conical diaphragm secured to a housing wherein a post integral with the housing extends from the base of the diaphragm inwardly toward the apex of the diaphragm and the distal end of the post is disposed adjacent the apex.

Further objects and advantages of the present invention will become apparent as the following description proceeds and the features of novelty characterizing the invention will be pointed out with particularity in the claims annexed to and forming a part of this specification.

Briefly, the present invention is concerned with an acoustic transducer of the piezoelectric type wherein the piezoelectric element is secured to the apex of a conical diaphragm and forms a part of a relaxation oscillator circuit. The piezoelectric element performs the dual function of developing acoustic energy and transferring such energy to the diaphragm and functioning as an electronic component in the oscillator circuit by operating as a frequency determining capacitor in such circuit. The diaphragm and the piezoelectric element are enclosed in a housing. Portions of the housing are deformed by the application of heat and penetrate the base of the conical diaphragm for securing the diaphragm to the housing. A post integral with the housing extends inwardly from the base of the diaphragm toward the apex with one end of the post being disposed adjacent the apex of the diaphragm.

For a better understanding of the present invention, reference may be had to the accompanying drawings wherein the same reference numerals have been applied to like parts and wherein.

Figure 1:
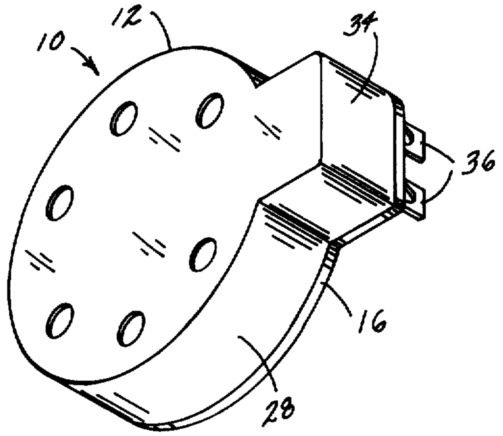
FIG. 1 is an isometric view of an acoustic transducer built in accord with the present invention.
Figure 2:
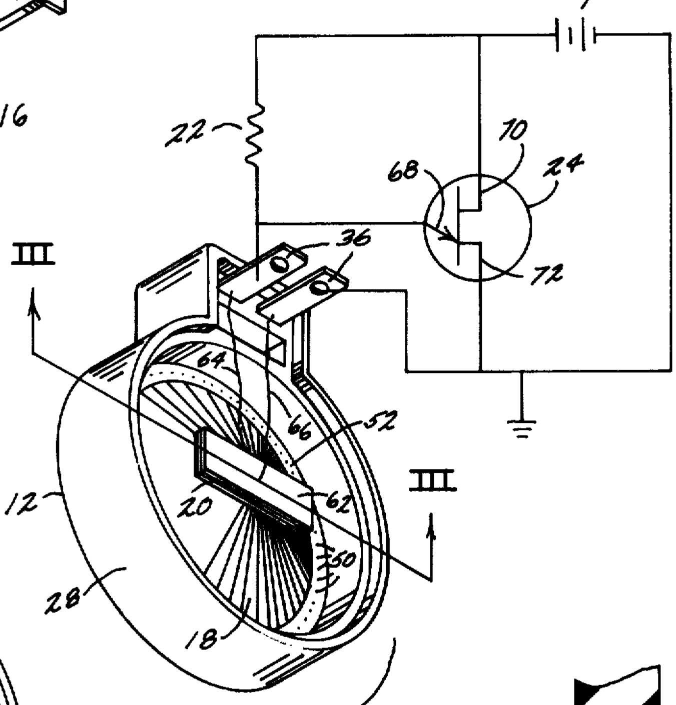
FIG. 2 is an exploded isometric view of the acoustic transducer of FIG. 1 illustrates the piezoelectric element as a part of a relaxation oscillator circuit.
Figure 2:
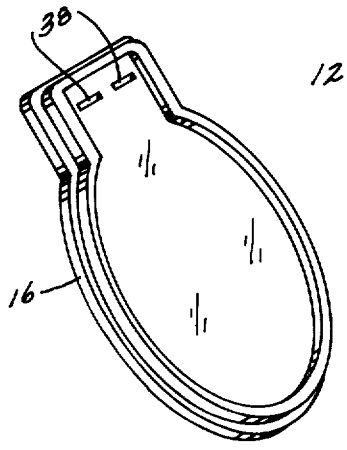
Figure 4:
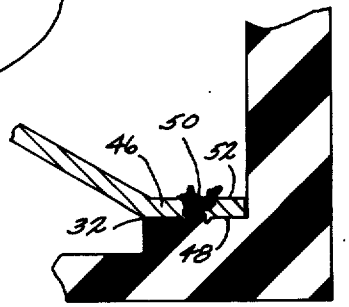
Figure 3:
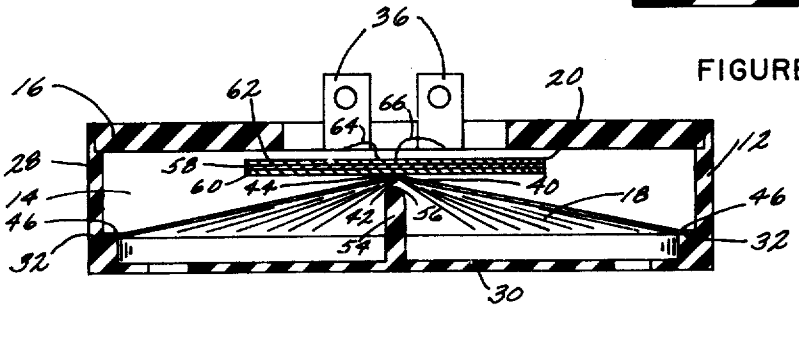

FIG. 3 is a sectional view taken along lines III-III of FIG. 2 assuming that the cover closes the housing; and FIG. 4 is an enlarged fragmentary view of the diaphragm secured to the housing Referring now to the drawings, there is illustrated an acoustic transducer generally designed at 10, comprising a molded plastic housing 12 defining a cavity 14, a cover 16 closing the cavity 14, a diaphragm 18 of fiber impregnated plastic or other suitable material secured to the housing 12 and a transducer element in the form of a piezoelectric element 20 attached to the diaphragm 18 and, as illustrated in FIG. 2, forming part of a relaxation oscillator circuit. Completing the oscillator circuit are a resistor 22, a unijunction transistor 24, and a voltage source illustrated as a battery 26.

Considering first the housing 12, it comprises an annular portion 28 having a back wall 30 supporting an annular ledge 32, as best seen in FIG. 3. A rectangular portion 34 of the housing 12 supports a pair of terminals 36 and the cover 16 interfits with the annular portion 28 and the rectangular portion 34 and is secured to the housing 12 by adhesive or other suitable means. A pair of elongated slots 38 are provided in the cover 16 and the terminals 36 extend through the slots 38. It should be understood that the cover can be used to support the resistor and the unjunction transistor and to connect them by appropriate conductive paths to the piezoelectric element and also used to support various other electrical circuits.

The diaphragm 18 is cone shaped having an apex section 40 with an inner surface 42 and outer surface 44 and a base 46 secured to the ledge 32 of the housing 12. In accord with the present invention, as best seen in FIG. 4, a first surface 48 of the base 46 engages the ledge 32 of the housing 12 and portions 50 of the ledge 32 are deformed into engagement with a second surface 52 of the base spaced apart from the first surface 48. Specifically, a tool providing heat penetrates the base 46 at a plurality of uniformly spaced locations around the periphery of the base causing portions 50 of the ledge 32 of the housing to flow through the base 46 and engage the second surface 52. The deforming of portions 50 of the ledge 32 into engagement with the base 46 at a plurality of spaced locations around the periphery of the base secures the diaphragm 18 uniformly and rigidly to the housing 12. Extending inwardly from the center of the back wall 30 toward the apex section 40 of the diaphragm 18 is a post 54. The distal end 56 of the post 54 is spherically shaped and disposed adjacent the inner surface 42 of the apex section 40 to prevent collapse of the diaphragm 18 due to mechanical shocks to the housing 12.

The piezoelectric element 20 is a unimorph element comprising a rectangular piece of piezoelectric material 58 as best seen in FIG. 3. Preferably, the piezoelectric material 58 is relatively thin for flexing against the diaphragm 18 and comprises lead zirconate titanate. One surface of the piezoelectric material 58 is bonded flush with a rectangular brass plate 60 by conductive epoxy and the other surface of the piezoelectric material 58 is completely coated with a conductive material 62 such as silver or nickle. Preferably, leads are attached to the geometrical center of the piezoelectric material 58 by attaching a first lead 64 with solder to the center of the brass plate 60 and by attaching a second lead 66 with solder to the center of the conductive material 62 on the surface of the piezoelectric material 58. The brass plate 60 is rigidly secured to the outer surface 44 of the apex section 40 by epoxy or other suitable means to securely attach the diaphragm 18 to the piezoelectric element 20. As seen in FIG. 2, each of the leads 64 and 66 is connected to a respective terminal 36 secured in the housing 12.

The unijunction transistors 24 comprises an emitter electrode 68, a first base electrode 70, and a second base electrode 72. The brass plate 60 is electrically connected to one end of the resistor 22 and the oter end of the resistor 22 is connected to the first base electrode 70 of the transistor 24. One terminal of the voltage source 26 is connected to the junction of the resistor 22 and the first base electrode 70. The conductive material 62 is electrically connected to the second base electrode 72 of the transistor 24 at ground potential and the other terminal of the voltage source 26 is connected to the junction of the conductive material 62 of the second base electrode 72. It should be understood that the conductive 62 could be connected to the resistor 22 rather than the brass plate 60 with the brass plate 60 being connected to the second base electrode 72. The emitter electrode 68 of the unijunction transistor 24 is connected to the junction of the resistor 22 and the brass plate 60. The piezoelectric element 20 functions as the capacitor in the relaxation oscillator circuit determining the frequency of oscillation, In its quiescent state, the piezoelectric element 20 is initially in an uncharged condition. When the circuit is energized, for example, by the closing of a not shfown switch, a charging current begins to flow from the voltage source 26 through the resistor 22 to the piezoelectric element 20 and continues until the piezoelectric element 20 is charged up to a sufficiently high voltage level to bias the unijunction transistor 24 into conduction. The piezoelectric element 20 is then discharged through the emitter electrode 68 and the second electrode 72 to ground, shutting off the transistor 24 and beginning the recharge of the piezoelectric element 20. This charging and discharging cycle is repeated and the repetition rate is determined by the time constant of the piezoelectric element and the resistor charging circuit. The piezoelectric element 20 also serves to develop acoustic energy, i.e., the piezoelectric element 20 is excited into flexural vibration by electrical excitation and these vibrations are mechanically transferred to the diaphragm 18. Specifically, when the charging and discharging currents are impressed upon the piezoelectric element 20, stresses are set up on the piezoelectric material 58 causing displacement which is coupled to the diaphragm 18.

The length and thickness of the piezoelectric material 58 generally determines the mechanical resonance of the piezoelectric element 20 and the area of the brass plate 60 and the conductive material 62 together with the resistor 22 determine the time constant of the relaxation oscillator circuit. In one embodiment a 1⅝ 3/8 inches × 3/8 inch pieszoelectric material was used having a capacitance of approxiamtely 0.05 microfarads and a resonant frequency of approximately 2,400 Hz. When connected to a 12 volt automotive battery, a very low current was drawn in the order of 3 milliamps. It should be understood that various other oscillator circuits can be interconnected to the piezoelectric element providing continuous audio signals at various frequencies or intermittent audio signals of different duration at the same frequency.

While there has been illustrated and described what at present is considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent of the United States is:

1. In an acoustic transducer, the combination of a housing defining a cavity, a diaphragm disposed within the cavity, the diaphragm defining a cone having a base and an apex section provided with an inner surface and an outer surface, a portion of the housing being deformed into engagement with the base and securing the diaphragm to the housing, a post secured to the housing and extending inwardly from the base toward the apex section, one end of the post being disposed adjacent the inner surface, and an oscillator circuit connected to the diaphragm, the oscillator circuit comprising a piezoelectric element having a first and a second conductor and a piezoelectric material disposed between the first and second conductors, the piezoelectric element being secured to the outer surface of the apex section, the piezoelectric element adapted to a dual function by firstly developing acoustic energy and transferring such energy to the diaphragm and secondly functioning as an electronic component in the oscillator circuit by operating as a frequency determining capacitor in such circuit, a resistor connected to the first conductor and a unijunction transistor having an emitter and a first and a second base electrode, the emitter being connected to the junction between the resistor and the first conductor of th piezoelectric element, the first base electrode being connected to the other end of the resistor and the second base electrode being connected to the second conductor of the piezoelectric element whereby an operating potential applied across the resistor and the piezoelectric element charges the piezoelectric element to a sufficiently high voltage level to bias the transistor into conduction.

2. In a acoustic transducer, the combination of a housing, a piezoelectric element having a first conductor and a second conductor, a conical diaphragm havng a base and an apex, the base being secured to the housing, the apex being secured to the piezoelectric element, a resistor having one end connected to the first conductor of the piezoelectric element and, a transistor comprising a first, a second and a third electrode, the first electrode being connected to the junction between the resistor and the first conductor of the piezoelectric element, the second electrode being connected to the other end of the resistor, the third electrode being connected to the second conductor of the piezoelectric element, the piezoelectric element and the resistor and the transistor defining an oscillator circuit, whereby upon application of a voltage potential between the second electrode and the third electrode the piezoelectric element performs the dual function of firstly developing acoustic energy and transferring such energy to the diaphragm and secondly functioning as a frequency determining capacitor in the oscillator circuit.

3. The acoustic transducer of claim 2 wherein the piezoelectric element comprises a rectangular piezoelectric material, and one of the conductors is a metal plate bonded to one surface of th piezoelectric material.

4. The acoustic transducer of claim 3, wherein the metal plate is a brass plate and is secured to the apex, and the other conductor is a conductive material deposited on the other surface of the piezoelectric material.

5. The acoustic transducer of claim 4, wherein the oscillator circuit comprises a first and a second lead wire secured to the piezoelectric element, the first lead wire interconnecting one of the conductive material and brass plate and the resistor and the second lead wire interconnecting the other of the brass plate and the conductive material and the third electrode, each of the lead wires being secured at the geometric center of the piezoelectric element.

6. In an acoustic transducer, the combination of a housing, a diaphragm supported by the housing, a transducer element secured to the diaphragm, a first conductor and a second conductor connected to the transducer element, termination means connected to the first and second conductors for connecting the transducer element to an external circuit, the transducer element producing acoustic energy upon being energized by the external circuit, the housing supporting the diaphragm distal of the transducer element and being provided with at least two appertures, the apertures communicating from within the housing to without the housing, and a post extending from one of the housing and diaphragm and disposed adjacent but spaced from the other of the housing and diaphragm for preventing collapse of the diaphgragm when the diaphragm is energized, the post being disposed between the diaphragm and the housing on the side of the diaphragm opposite of the transducer element.

7. The acoustic transducer of claim 6, wherein the housing comprises a wall, the diaphragm having a base and an apex, the post being integral with the wall and extending from the center of the base toward the apex, the distal end of the post being spherically shaped and disposed adjacent to the apex.

* * * * *